United States Patent
Dobrzynska et al.

(10) Patent No.: US 12,094,791 B2
(45) Date of Patent: Sep. 17, 2024

(54) POWER SEMICONDUCTOR DEVICE WITH FREE-FLOATING PACKAGING CONCEPT

(71) Applicant: Hitachi Energy Ltd, Zürich (CH)

(72) Inventors: Jagoda Dobrzynska, Lenzburg (CH); Jan Vobecky, Lenzburg (CH); David Guillon, Vorderthal (CH); Tobias Wikstroem, Egliswil (CH)

(73) Assignee: Hitachi Energy Ltd, Zürich (CH)

( * ) Notice: Subject to any disclaimer, the term of this patent is extended or adjusted under 35 U.S.C. 154(b) by 822 days.

(21) Appl. No.: 17/286,737

(22) PCT Filed: Oct. 10, 2019

(86) PCT No.: PCT/EP2019/077449
§ 371 (c)(1),
(2) Date: Apr. 19, 2021

(87) PCT Pub. No.: WO2020/078816
PCT Pub. Date: Apr. 23, 2020

(65) Prior Publication Data
US 2021/0384091 A1    Dec. 9, 2021

(30) Foreign Application Priority Data
Oct. 19, 2018 (EP) ..................... 18201552

(51) Int. Cl.
*H01L 23/10* (2006.01)
*H01L 21/56* (2006.01)
(Continued)

(52) U.S. Cl.
CPC .......... *H01L 23/051* (2013.01); *H01L 21/565* (2013.01); *H01L 23/10* (2013.01); *H01L 23/3185* (2013.01)

(58) Field of Classification Search
CPC ........................... H01L 23/10; H01L 23/3185
See application file for complete search history.

(56) References Cited

U.S. PATENT DOCUMENTS 3,475,660 A    10/1969 Coblenz
4,129,881 A    12/1978 Reichel et al.
(Continued)

FOREIGN PATENT DOCUMENTS

CN    107644858 A    1/2018
CN    107924882 A    4/2018
(Continued)

OTHER PUBLICATIONS

Vobecky, Jan, et al., "Housing Less High Voltage Fast Recovery Diode", An IP.com Prior Art Database Technical Disclosure, IPCOM000247713D, published Sep. 29, 2016, 5 pages.
(Continued)

*Primary Examiner* — Tucker J Wright
(74) *Attorney, Agent, or Firm* — Slater Matsil, LLP

(57) ABSTRACT

A power semiconductor device includes a semiconductor wafer having a junction and a junction termination laterally surrounding the junction. A protection layer covers the lateral side of the semiconductor wafer and covers the second main side at least in an area of the junction termination. A first metal disk is arranged on the first main side to cover the first main side of the semiconductor wafer. An interface between the first metal disk and the semiconductor wafer is a free floating interface. A metal layer sandwiched between the first metal disk and the semiconductor wafer.

21 Claims, 6 Drawing Sheets

(51) Int. Cl.
*H01L 23/051* (2006.01)
*H01L 23/31* (2006.01)

(56) References Cited

U.S. PATENT DOCUMENTS

| | | | |
|---|---|---|---|
| 4,254,431 | A | 3/1981 | Babuka et al. |
| 5,489,802 | A | 2/1996 | Sakamoto et al. |
| 5,506,452 | A * | 4/1996 | Kuhnert ............... H01L 23/051 |
| | | | 257/E23.03 |
| 2008/0296774 | A1 | 12/2008 | Kellner-Werdehausen et al. |
| 2014/0284615 | A1 | 9/2014 | Mauder et al. |
| 2018/0026005 | A1 | 1/2018 | Kobolla et al. |
| 2018/0090401 | A1 | 3/2018 | Mohn et al. |

FOREIGN PATENT DOCUMENTS

| | | |
|---|---|---|
| DE | 2039806 A1 | 2/1972 |
| DE | 4321053 A1 | 1/1994 |
| DE | 19627426 A1 | 1/1998 |
| EP | 1115151 A1 | 7/2001 |

OTHER PUBLICATIONS

Klaka, S., et al., "Reduction of Thermomechanical Stress by applying a Low Temperature Joining Technique", Proc. of the 6th Internat. Symposium on Power Semiconductor Devices & IC's, Davos, Switzerland, May 31-Jun. 2, 1994, pp. 259-264.

Zhang, Zhiye, et al., "Pressure-Assisted Low-Temperature Sintering of Silver Paste as an Alternative Die-Attach Solution to Solder Reflow", IEEE Transactions on Electronics Packaging Manufacturing, vol. 25, No. 4, Oct. 2002, pp. 279-283.

ABB Semiconductors AG, "Fast Recovery Diode", 5SDF 03D4502 Prelminary, Doc. No. 5SYA1117-02, Sep. 2001, 5 pages.

* cited by examiner

POWER SEMICONDUCTOR DEVICE WITH FREE-FLOATING PACKAGING CONCEPT

CROSS-REFERENCE TO RELATED APPLICATIONS

This application is a national stage application of International Application No. PCT/EP2019/077449, filed on Oct. 10, 2019, which claims priority to European Patent Application No. 18201552.9, filed on Oct. 19, 2018, which applications are hereby incorporated herein by reference.

FIELD OF THE INVENTION

The present invention relates to a power semiconductor device comprising a semiconductor wafer and a first metal disk arranged on a first main side of the semiconductor wafer, wherein an interface between the first metal disk and the semiconductor wafer is free floating, and to a method for manufacturing such power semiconductor device.

BACKGROUND OF THE INVENTION

Known high power semiconductor devices have a junction arranged in an active region of a semiconductor wafer. To avoid electric field crowding at an edge of a main contact resulting in breakdown of the device at a relatively low breakdown voltage VBR, these power semiconductor devices require an efficient junction termination. For silicon-based power semiconductor devices known junction termination techniques include single-side single negative bevel, single positive bevel, double positive bevel, combined positive-negative bevel, or a planar junction termination such as junction termination extension (JTE), variation of lateral doping (VLD) and floating field ring terminations (FFR) with and without field plate extensions. A passivation layer made of an insulating material such as silicon oxide, silicon nitride or diamond like carbon (DLC) is formed on the semiconductor wafer in a circumferential edge for surface passivation and electrical insulation of the junction termination. In addition to a relatively thin passivation layer made from silicon oxide, silicon nitride or diamond like carbon (DLC) or any other appropriate inorganic material, an organic silicone rubber is arranged to cover the edge of the semiconductor wafer and to overlap the main contact such that a distance between top and bottom electrodes (creepage distance) is prolonged and ionization of housing inner atmosphere or surface material (sparking) is avoided.

A common packaging technology for the high power semiconductor devices is a press-pack type packaging, in which a semiconductor wafer is clamped between two copper pole pieces under pressure to obtain proper thermal and electric contact between the semiconductor wafer and the copper pole pieces acting as external electrodes. Usually a pressure in a range between 10 N/mm$^2$ and 20 N/mm$^2$ is applied. During operation of the high power semiconductor device heat is generated resulting in operating temperatures up to 180° C. or even higher for a short period of time. Because of the difference between the coefficient of thermal expansion of the semiconductor wafer and that of the copper pole pieces, the copper pole pieces cannot be directly attached to the semiconductor wafer. Molybdenum has a coefficient of thermal expansion that is close to that of silicon and also has a great hardness. Therefore, molybdenum disks sandwiched between the two copper pole pieces and the semiconductor wafer, respectively, are used to compensate for the difference between the coefficient of thermal expansion of the semiconductor wafer and that of the copper pole pieces. In application the press-pack comprising the semiconductor wafer, the molybdenum disks and the copper pole pieces are inserted between coolers to remove the heat generated by the semiconductor wafer during operation.

For obtaining a good thermal and electric contact between the semiconductor wafer and the molybdenum disk it is common practice to bond the semiconductor wafer to the molybdenum disk by soldering, by low temperature bonding (LTB) and nano-LTB using nano-silver or nano-copper paste or foil, or by brazing. Also with the molybdenum disk firmly bonded to the semiconductor wafer by the LTB process bowing of the semiconductor wafer is minimized when applying inhomogeneous pressure onto both sides of the semiconductor wafer in a press-pack, which is the case when different sized molybdenum disks are used for the top and the bottom side of the device, for example. Without bonding the molybdenum disk to the semiconductor wafer, the semiconductor wafer easily breaks when it is sandwiched between different sized molybdenum disks under pressure in a press-pack. On the other side any bonding, brazing or soldering process involves the risk of wafer bow or deformation.

In the publication "Reduction of Thermomechanical Stress by applying a Low Temperature Joining Technique" by S. Klaka and R. Sittig, Proc. of the 6$^{th}$ International Symposium on Power Semiconductor Devices & ICs, Davos, Switzerland, May 31 to June 1994, it is discussed a low temperature joining technique for bonding a silicon wafer to a molybdenum disk which reduces the thermomechanical stress between the bonded materials. This LTJ-technique is based on pressure sintering of silver powder. From the publication "Housing Less High Voltage Fast Recovery Diode" by Jan Vobecky et al. (IP.com Prior Art Database Technical Disclosure, IP.com Number: IPCOM000247713D, published on Sep. 29, 2016) it is known a housing less fast recovery diode (HL-FRD), in which a rubber protection of a junction termination is replaced by a mold compound polymer which serves as a hermetic protection of a surface passivation by diamond like carbon (DLC). In this prior art the semiconductor wafer is sandwiched between two molybdenum disks, which have a different diameter. The larger molybdenum disk is bonded to the backside of the semiconductor wafer. However, bonding the molybdenum disk to the semiconductor wafer involves the risk to generate conductive particles on the wafer in the area of the junction termination and increases the manufacturing costs.

DE 2 039 806 A1 discloses a semiconductor power device in which a semiconductor wafer is clamped between two molybdenum disks, wherein the molybdenum disks are not bonded to the wafer. It is pointed out in this prior art document that it is necessary that the two molybdenum disks must have the same size to avoid breakage of the semiconductor wafer due to inhomogeneous pressure application. In DE 2 039 806 A1 the two molybdenum disks have both a smaller diameter than the semiconductor wafer. This results in a relatively bad removal of heat generated in the circumferential edge region of the wafer which is not in contact with the molybdenum disks.

From DE 196 27 426 A1 it is known a thyristor, which comprises a semiconductor wafer that is arranged within a hermetically sealed housing, wherein the housing comprises two parallel, disc-like electrodes. The semiconductor wafer is arranged between two molybdenum disks without bonding the molybdenum disks to the semiconductor wafer. The stack of molybdenum disks and the wafer is held between the electrodes by pressure. Both molybdenum disks have the same diameter smaller than that of the wafer. As for the above prior art this results in a relatively bad removal of heat generated during device operation, in particular in the circumferential edge region of the wafer which is not in contact with the molybdenum disks.

From U.S. Pat. No. 5,489,802 A it is known press-pack wherein a molybdenum disk is glued to a semiconductor wafer by a silicone rubber. To prevent the silicone rubber from entering the gap between the molybdenum disk and the wafer, an O-ring is arranged between the wafer and the molybdenum disk along the circumferential edge of the wafer. Accordingly, also in this prior art, heat dissipation is bad, because heat is not efficiently removed from a circumferential edge region of the semiconductor wafer.

From US 2008/296774 A1 it is known a thyristor device comprising a semiconductor element having opposing first and second contact faces, compensating elements 40a and 40b and a silicone passivation covering the edge of the semiconductor element and lateral faces of the compensating elements.

From US 2018/090401 A1 it is known a semiconductor device, which comprises a wafer sandwiched between two electrodes. A molybdenum layer is interposed between the lower electrode and the wafer. The molybdenum layer clamped between the wafer and the lower electrode. A rubber ring covers a rim of the wafer and the side of the wafer.

According to U.S. Pat. No. 4,129,881 A a power device comprises a wafer, a molybdenum or tungsten reinforcing disc, a lower electrode and an upper electrode. The wafer is sandwiched between the lower and upper electrode. The molybdenum or tungsten reinforcing disc is hardsoldered to the lower surface of the wafer and arranged between the lower terminal electrode and the wafer. A metal layer, which is liquid during the operation of the device, is interposed between the lower terminal electrode and the reinforcing disc.

SUMMARY OF THE INVENTION

In view of the above disadvantages in the prior art it is an object of the invention to provide a power semiconductor device in which heat dissipation is efficient while wafer breakage can be avoided and the risk of device failure due to conductive particles on a junction termination of a semiconductor wafer can be reduced.

The object is attained by a power semiconductor device according to claim 1. Further developments of the invention are specified in the dependent claims.

In the invention the first metal disk arranged on a first main side of the semiconductor wafer has a lateral size that is the same as or larger than a lateral size of the semiconductor wafer to cover the first main side of the semiconductor wafer. Wafer breakage during application of pressure in a press-pack can surprisingly be avoided due to the relatively large lateral size of the first metal disk, which is the same or larger than a lateral size of the semiconductor wafer, even if the semiconductor wafer is sandwich between the first metal disk and a second metal disk having a smaller lateral size than the semiconductor wafer under pressure. Moreover the lateral size of the first metal disk which is the same or larger than a lateral size of the semiconductor wafer ensures an efficient removal of heat from the semiconductor wafer in particular in a circumferential edge region of the semiconductor wafer.

In the power semiconductor device of the invention the interface between the first metal disk and the semiconductor wafer is a free floating interface, i.e. the first metal disk is neither bonded nor brazed nor soldered to the first main side of the semiconductor wafer so that the first metal disk can slide along the first main side when laterally expanding due to heating up during operation of the power semiconductor device. This can reduce the compressive or tensile stress generated in the first metal disk and in the semiconductor wafer during a temperature change. Avoiding any bonding, brazing or soldering process can avoid wafer bow or deformation. Also, avoiding any bonding, brazing or soldering process can avoid the risk of particle generation on the semiconductor wafer in the junction termination area. Accordingly, the risk of device failure due to conductive particles on a junction termination of a semiconductor wafer can be reduced.

In the invention the first metal disk is a molybdenum or tungsten disk. Molybdenum and tungsten have a coefficient of thermal expansion that is close to the coefficient of thermal expansion of common semiconductor materials such as silicon or silicon carbide.

In the invention a metal layer is sandwiched between the first metal disk and the semiconductor wafer, the metal layer having a melting point below 150° C., exemplarily below 125° C., exemplarily below 100° C. Such metal layer improves the thermal and electrical coupling (i.e. it boosts the interface conductivity) between the semiconductor wafer and the first metal disk to reduce on-state losses and improve removal of heat during device operation.

In an exemplary embodiment the material of the protection layer is a thermosetting polymer material. A thermosetting polymer can be molded by transfer molding. Transfer molding has the advantage compared to other molding techniques that the viscosity of the thermosetting polymer during the transfer molding process is relatively high so that the thermosetting polymer does not easily enter into a gap between the first main side of the semiconductor wafer and the first metal disk. Other advantages of transfer molding compared to other molding techniques, such as injection molding, are relatively low molding equipment costs, short cycle time, and low tool maintenance costs.

In an exemplary embodiment the material of the protection layer is an epoxy or a hybrid epoxy imide compound polymer. Such materials have a low shrinkage, low water absorption, good adhesion to diamond like carbon (DLC), nickel (Ni), ruthenium (Ru), silicon (Si) surfaces, small elastic modulus, low coefficient of thermal expansion close to that of silicon and molybdenum resulting in a low build-in stress after the manufacturing process. These properties allow the protection layer to hermetically seal and protect a wafer surface of the junction termination.

In another exemplary embodiment the protection layer is made of a rubber, exemplarily a silicone rubber. Rubber and in particular silicone rubber has good electrical insulation effect and is resistant against high operation temperatures.

In an exemplary embodiment the power semiconductor device comprises a passivation layer formed on the second main side to cover the junction termination, wherein the protection layer hermetically seals the passivation layer.

In an exemplary embodiment the first metal disk is fixed to the semiconductor wafer by the protection layer, which is fixed to the semiconductor wafer and to the first metal disk. Fixing the first metal disk to the semiconductor wafer by the protection layer, which is fixed to the semiconductor wafer and to the first metal disk, is a reliable fixing technique. In an exemplary embodiment the protection layer seals the interface between semiconductor wafer and the first metal disk against an atmosphere surrounding the power semiconductor device. Exemplarily the protection layer is fixed or glued to a side surface of first metal disk and/or to a circumferential edge portion of an upper surface of the first metal disk, wherein the upper surface of the first metal disk faces towards the semiconductor wafer.

In an exemplary embodiment the power semiconductor device comprises a second metal disk arranged on the second main side of the semiconductor wafer, wherein an interface between the second metal disk and the semiconductor wafer is a free floating interface, i.e. the second metal disk is neither bonded nor brazed nor soldered to the second main side of the semiconductor wafer so that the second metal disk can slide along the second main side when laterally expanding due to heating up during device operation. As discussed above for the free floating interface between the first metal disk and the semiconductor wafer, the free floating interface between the second metal disk and the semiconductor wafer can likewise reduce compressive or tensile stress generated in the second metal disk and in the semiconductor wafer during a temperature change. Avoiding any bonding, brazing or soldering process can avoid wafer bow or deformation. Also, avoiding any bonding, brazing or soldering process can avoid the risk of particle generation on the semiconductor wafer in the junction termination area, and reduce the manufacturing costs. Accordingly, the risk of device failure due to conductive particles on a junction termination of a semiconductor wafer can be further reduced.

In an exemplary embodiment the second metal disk is a molybdenum or tungsten or silver disk. Molybdenum and tungsten have a coefficient of thermal expansion that is close to the coefficient of thermal expansion of common semiconductor materials such as silicon or silicon carbide, while silver has a relatively high electrical conductivity.

In an exemplary embodiment the metal layer may be a layer of an eutectic alloy based on Gallium (Ga), which eutectic alloy remains liquid at room temperature (e.g. 20° C.) and under device operation, for example an eutectic alloy of GaIn, GaInSn and GaInZn. The metal layer may also be a layer of any one of gallium (Ga), indium (In), cesium (Cs), rubidium (Rb) and their alloys, likewise the metal layer may be a layer of any alloy of tin (Sn), bismuth (Bi), lead (Pb) and cadmium (Cd), or any alloy of aluminum (Al), gallium (Ga), indium (In), thallium, (Tl), or mixtures and alloys thereof.

In an exemplary embodiment a thickness of the metal layer is in a range from 0.1 µm to 500 µm, exemplarily from 1 µm to 100 µm.

In an exemplary embodiment of a method for manufacturing a power semiconductor device according to the invention the protection layer may exemplarily be formed by transfer molding.

BRIEF DESCRIPTION OF THE DRAWINGS

Detailed embodiments will be explained below with reference to the accompanying figures, in which.

Figure 1:
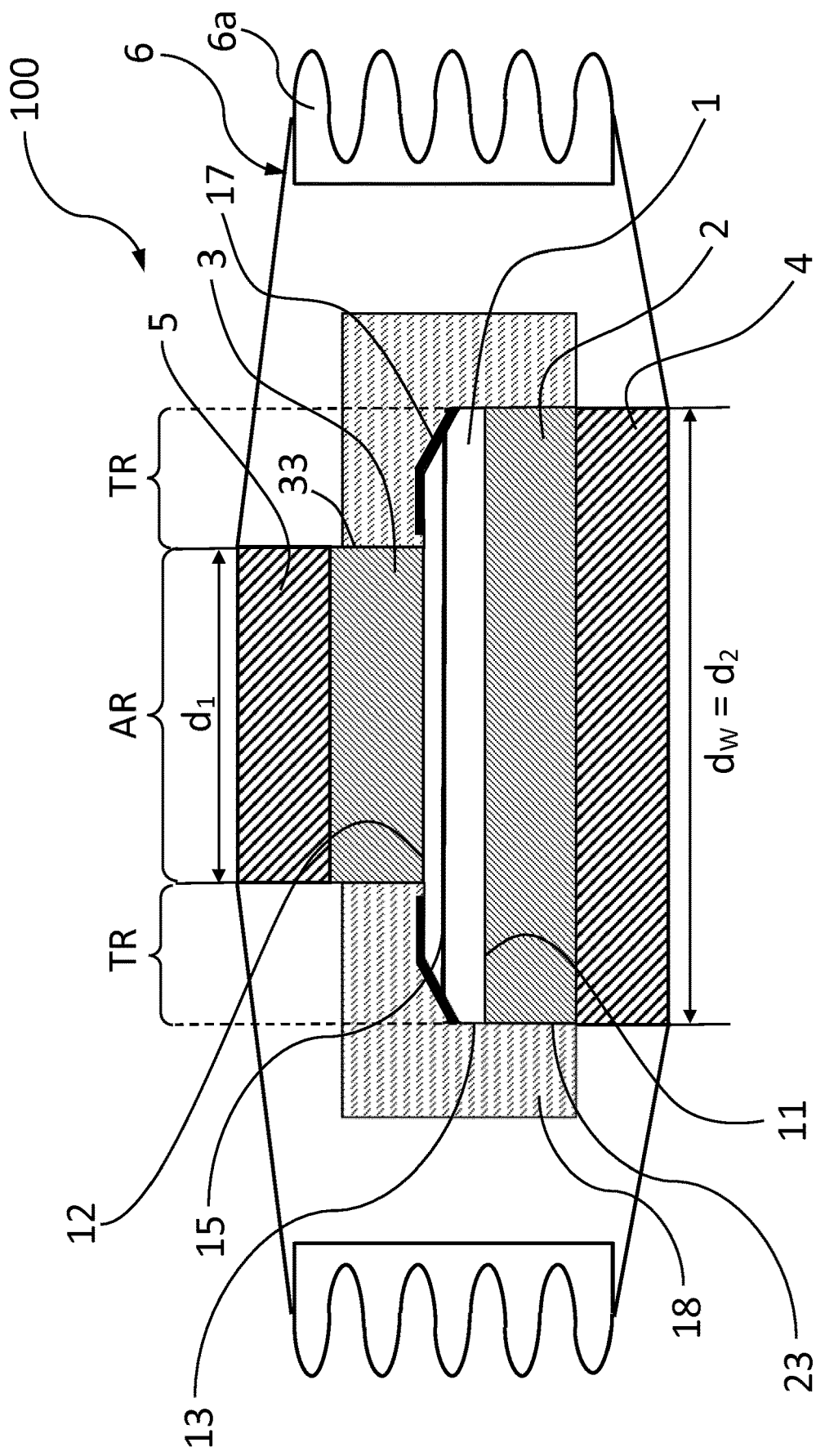
FIG. 1 shows a cross-section of a power semiconductor device according to a first embodiment.

The reference signs used in the figures and their meanings are summarized in the list of reference signs. Generally, similar elements have the same reference signs throughout the specification. The described embodiments are meant as examples and shall not limit the scope of the invention. It is to be note that only the second embodiment is described with all features of the claimed invention, whereas the other embodiments describe not all features of the invention but only aspects of the claimed invention. In particular the first, and third to sixth embodiment are described without the metal layer 30.

In the following a power semiconductor device 100 according to a first embodiment is described with reference to FIG. 1. The power semiconductor device 100 according to the first embodiment is a press-pack type device comprising a semiconductor wafer 1, a first metal disk 2, a second metal disk 3, a first pole piece 4, a second pole piece 5 and a housing 6. The semiconductor wafer 1 has a first main side 11, a second main side 12 opposite to the first main side 11, and a lateral side 13 connecting the first main side 11 and the second main side 12.

In an orthogonal projection onto a plane parallel to the first main side 11, the semiconductor wafer 1 has an active region AR in a central area of the semiconductor wafer 1 and a junction termination region TR that extends along a circumferential edge of the semiconductor wafer 1 to laterally surround the active region AR. Therein, any direction parallel to the first main side is a lateral direction. At least one junction 15 is formed in the active region AR of the semiconductor wafer 1. Depending on the type of the power device that is implemented by the semiconductor wafer, the at least one junction 15 may include a pn junction and/or a Schottky junction. In the termination region TR a junction termination is formed at the second main side 12 of the semiconductor wafer 1. The semiconductor wafer may be made of any semiconductor material appropriate for power semiconductor devices, such as silicon (Si), silicon carbide (SiC), gallium nitride (GaN), aluminium nitride (AlN), aluminium gallium nitride (AlGaN) or the like.

In the first embodiment illustrated in FIG. 1 the junction termination is exemplarily shown as a single-side single negative bevel. A passivation layer 17 which is exemplarily made of an insulating material, such as silicon oxide, silicon nitride, aluminium oxide, polyimide, or, which is made of a semi-insulating material like diamond like carbon (DLC), is formed on the semiconductor wafer 1 in a circumferential edge for surface passivation of the semiconductor wafer in the area of the junction termination. In addition to a relatively thin passivation layer made from silicon oxide, silicon nitride or diamond like carbon (DLC), for example, a protection layer 18 made of a molded material that is arranged to cover the lateral side 13 and the second main side 12 at least in the termination region TR of the semiconductor wafer 1. The protection layer 18 is arranged to overlap a metallization layer (not shown) acting as first main contact that is arranged on the second main side 12 of the semiconductor wafer 1 in the active region AR, such that the junction termination including the passivation layer 17 is hermetically sealed from the surrounding atmosphere.

The material of the protection layer 18 may exemplarily be a thermosetting polymer, an epoxy or a hybrid epoxy imide compound polymer, or a rubber such as a silicone rubber. The epoxy mold compound material may be made out of multifunctional resins such as multi-aromatic ring resin (MAR) and biphenyl aralkyl structures, naphthalen and fluorene structures, or alternative resins and co-polymer systems, such as bismaleimide, cyanate ester, polyimide or silicone.

In the first embodiment the first metal disk 2 is fixed or glued to the semiconductor wafer 1 by the protection layer 18 which is fixed or glued to the lateral side 13 of the semiconductor wafer 1 and to the second main side 12 in the termination region TR of the semiconductor wafer 1, and also to a lateral side surface 23 of the first metal disk 2. Likewise, the second metal disk 3 is fixed or glued to the semiconductor wafer 1 by the protection layer 18 which is fixed or glued to the lateral side surface 33 of the second metal disk 3. With the protection layer 18, which is fixed or glued to the semiconductor wafer 1 and to the lateral side surface 23 of the first metal disk 2, the protection layer 18 seals the interface between semiconductor wafer 1 and the first metal disk 2 efficiently against an atmosphere surrounding the power semiconductor device 100.

The first metal disk 2 and the second metal disk 3 are exemplarily molybdenum (Mo) or tungsten (W) disks, which have a coefficient of thermal expansion close to that of common semiconductor materials such as silicon (Si) or silicon carbide (SiC). The first metal disk 2 from Mo can be eventually combined with the second metal disk 3 from silver (Ag), which has the highest electrical conductivity. In an orthogonal projection onto a plane parallel to the first main side 11, the semiconductor wafer 1, the first metal disk 2 and the second metal disk 3 have a circular shape. The first and the second metal disks may be covered by an oxidation protection layer such as a ruthenium (Ru) layer. In the first embodiment the first metal disk 2 has a diameter $d_2$, which is a lateral size of the first metal disk 2, that is the same as a diameter $d_w$ of the semiconductor wafer 1, which diameter $d_w$ is a lateral size of the semiconductor wafer 1. The first metal disk 2 is arranged on the first main side 11 to cover the first main side 11 of the semiconductor wafer 1, i.e. to overlap in an orthogonal projection onto a plane parallel to the first main side 11 with the whole first main side 11 of the semiconductor wafer 1.

The interface between the first metal disk 2 and the semiconductor wafer 1 is a free floating interface, i.e. the first metal disk 2 is neither bonded nor brazed nor soldered to the first main side 11 of the semiconductor wafer 1 so that the first metal disk 2 can slide along the second main side 11 when laterally expanding due to heating up during operation of the power semiconductor device 100. In the first embodiment the first metal disk 2 (which may include an oxidation protection layer as discussed above) may be in direct electrical and physical contact with a metallization layer on the first main side 11 of the semiconductor wafer 1, which metallization layer acts as a second main contact.

The power semiconductor device 100 according to the first embodiment comprises a housing 6 including a ceramic housing portion 6a.

In the following a power semiconductor device 200 according to a second embodiment is described with reference to FIG. 2. Due to the many similarities between the first and the second embodiment, only differences between these two embodiments will be described. With regard to all other features it is referred to the above discussion of the first embodiment. In particular, elements having the same reference sign shall refer to elements having the same characteristics and features as the elements described above for the first embodiment. The power semiconductor device 200 according to the second embodiment differs from that according to the first embodiment in that a metal layer 30 is sandwiched between the first metal disk 2 and the semiconductor wafer 1, the metal layer 30 having a melting point below 150° C., exemplarily below 125° C., more exemplarily below 100° C. The metal layer 30 may include any one of Liquid Metal Thermal Interfaces (LMTI). It can be an eutectic alloy based on Gallium (Ga), for example eutectics of GaIn, GaInSn and GaInSnZn. It can also be gallium (Ga), indium (In), cesium (Cs), rubidium (Rb) and their alloys likewise the alloys of tin (Sn), bismuth (Bi), lead (Pb) and cadmium (Cd), or alloys of aluminum (Al), gallium (Ga), indium (In), thallium, (Tl), or mixtures and alloys thereof. A thickness of the metal layer 30 is in a range from 0.1 µm to 500 µm, exemplarily from 1 µm to 100 µm. The metal layer 30 improves the thermal and electrical contact between the first metal disk 2 and the semiconductor wafer 1 resulting in a more efficient heat removal and lower on-state losses of the power semiconductor device 200, while during operation the metal layer 30 may be in a liquid state to reduce compressive or tensile stress in the semiconductor wafer 1 and the first metal disk 2 due to different coefficients of thermal expansion of the semiconductor wafer 1 and the first metal disk 2. With the protection layer 18 being fixed or glued to the semiconductor wafer 1 and to the lateral side surface 23 of the first metal disk 2, the protection layer 18 efficiently encapsulates the metal layer 30 and prevents any leakage of material of the metal layer 30 in a liquid state.

Figure 3:
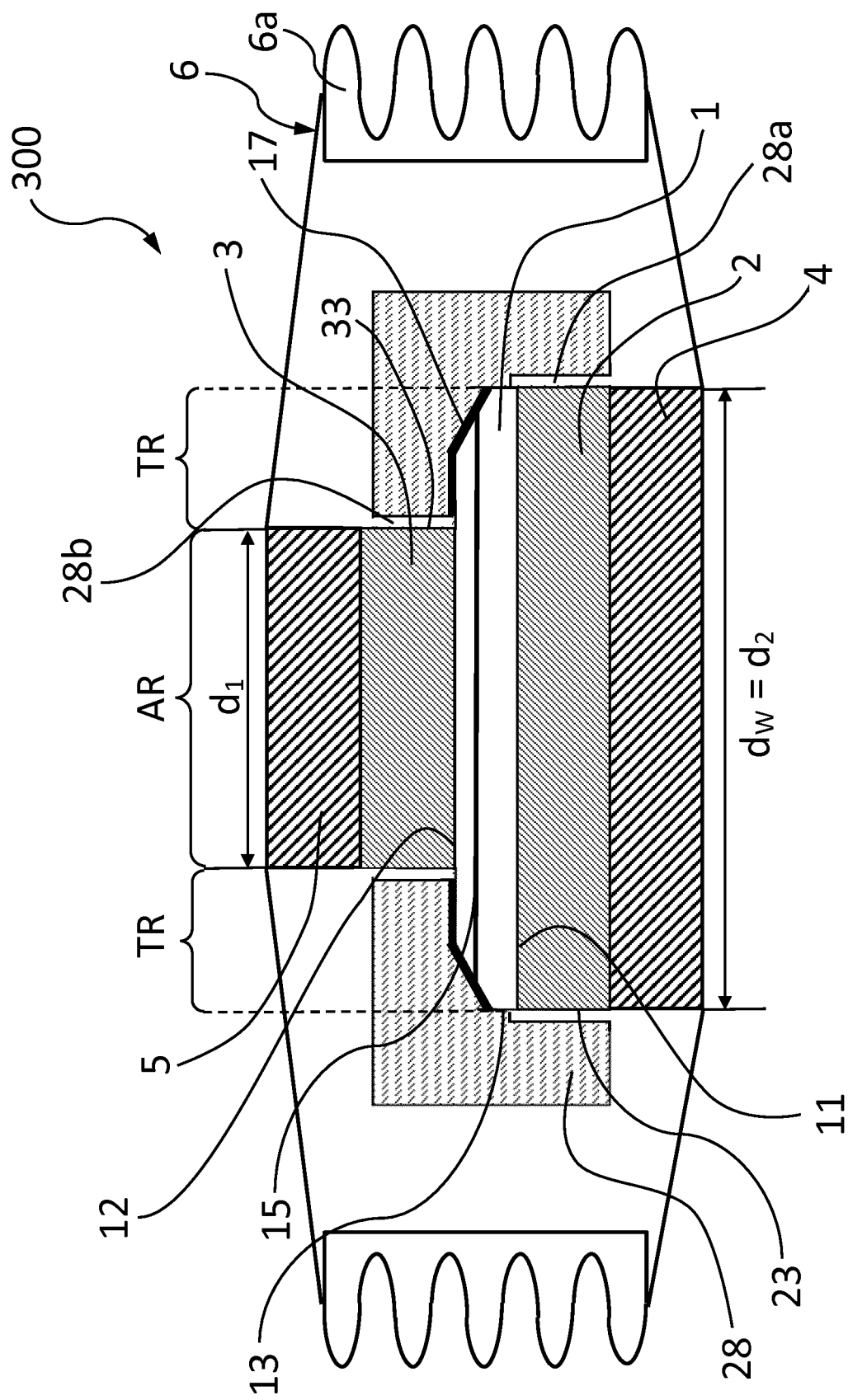
FIG. 3 shows a cross-section of a power semiconductor device according to a third embodiment.

In the following a power semiconductor device 300 according to a third embodiment is described with reference to FIG. 3. Due to the many similarities between the first and the third embodiment, only differences between these two embodiments will be described in the following. With regard to all other features it is referred to the above discussion of the first embodiment. The power semiconductor device 300 differs from the power semiconductor device 200 in that first metal disk 2 is not fixed or glued to the semiconductor wafer 1 by the protection layer 28. Accordingly, the protection layer 28 differs from the protection layer 18 in that it is not fixed or glued to the lateral side surface 23 of the first metal disk 2. In FIG. 3 this difference is reflected by a gap 28a between the lateral side surface 23 of the first metal disk 2 and the protection layer 28. Likewise, in contrast to the power semiconductor device 100, the protection layer 28 is also not fixed or glued to the lateral side surface 33 of the second metal disk 3, which is separated from the protection layer 28 by a gap 28b in FIG. 3. With regard to all other characteristics or features, the protection layer 28 may be the same as the above discussed protection layer 18 in the first embodiment. The power semiconductor 300 is most suitable for a power device that requires ion and/or electron irradiation after a device processing including forming the protection layer is completed.

Figure 4:
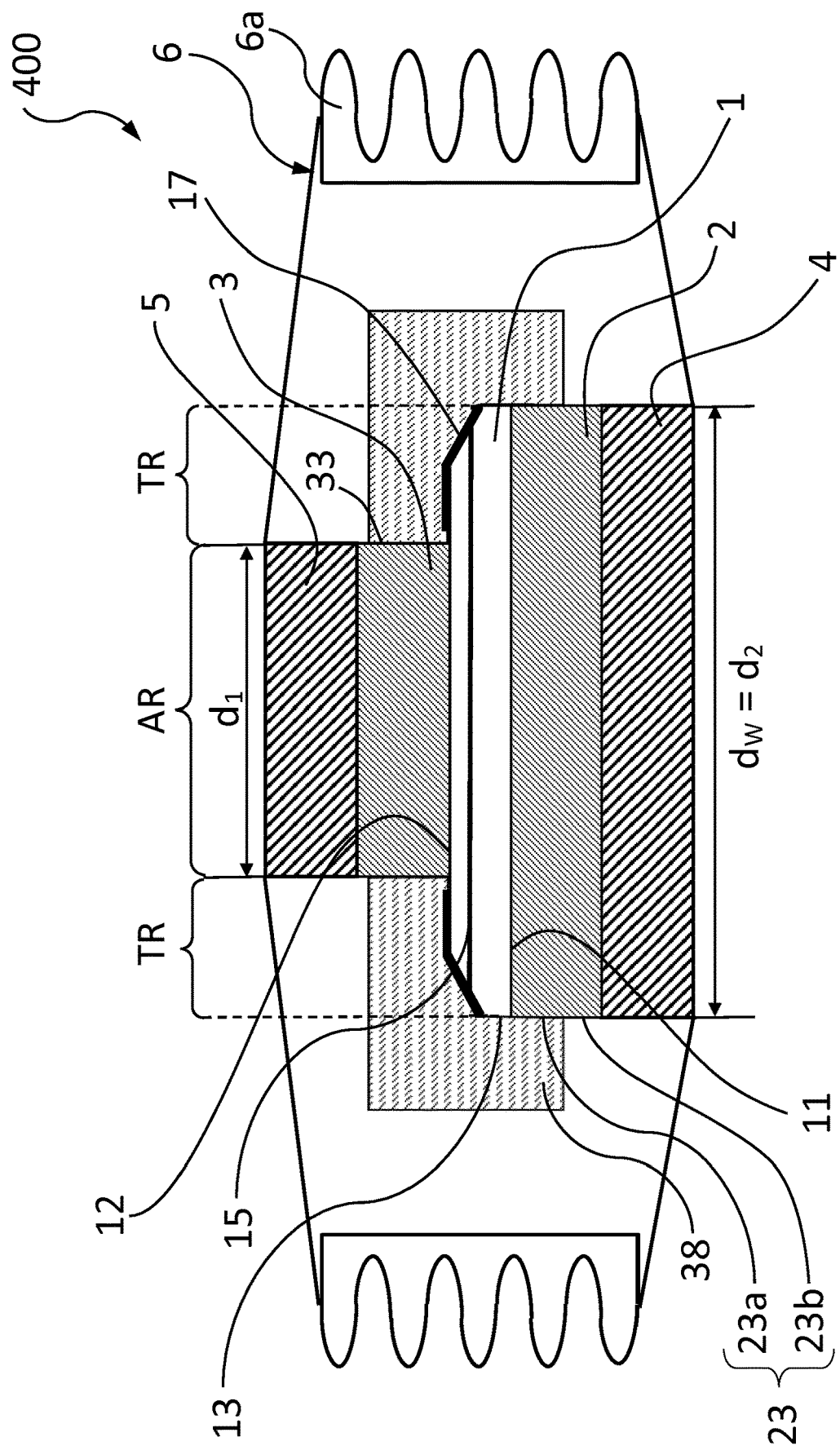
FIG. 4 shows a cross-section of a power semiconductor device according to a fourth embodiment.

In the following a power semiconductor device 400 according to a fourth embodiment is explained with reference to FIG. 4. Due to the many similarities between the first and the fourth embodiment, only differences between these two embodiments will be described in the following. With regard to all other features it is referred to the above discussion of the first embodiment. The power semiconductor device 400 differs from the above discussed power semiconductor device 100 in that the protection layer 38 is fixed or glued only to a portion 23a of the lateral side surface 23 of the first metal disk 2 as shown in FIG. 4. A lower portion 23b of the lateral side surface 23 of the first metal disk 2 is not fixed or glued to the protection layer 23. In all other aspects the protection layer 38 is the same as the protection layer 18 of the power semiconductor device 100 shown in FIG. 1.

Figure 5:
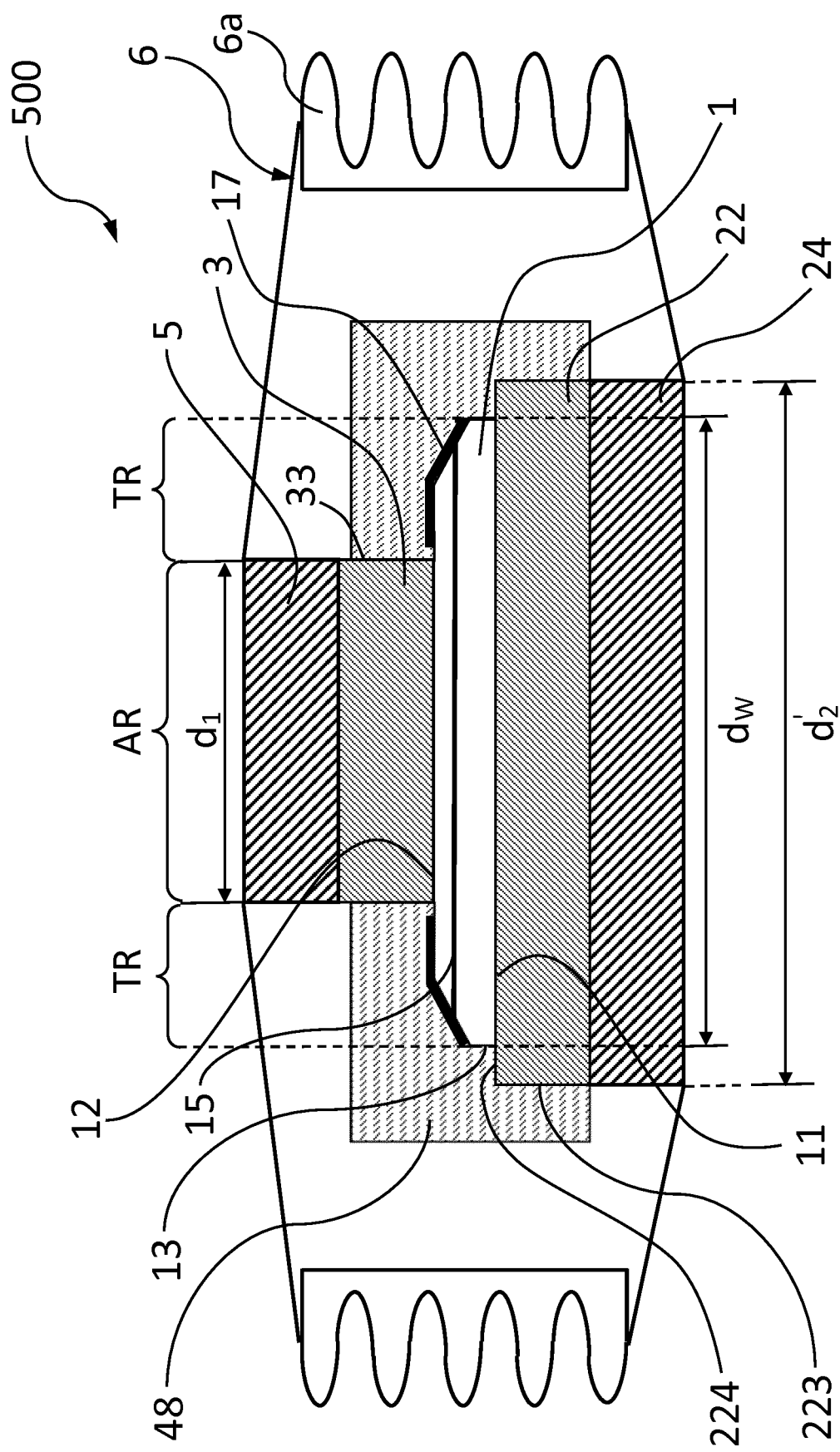
FIG. 5 shows a cross-section of a power semiconductor device according to a fifth embodiment.

In the following a power semiconductor device 500 according to a fifth embodiment is explained with reference to FIG. 5. Due to the many similarities between the first and the fifth embodiment, only differences between these two embodiments will be described in the following. With regard to all other features it is referred to the above discussion of the first embodiment. The power semiconductor device 500 differs from the above discussed power semiconductor device 100 in that the first metal disk 22 has a diameter $d_2'$, which is a lateral size of the first metal disk 2, that is larger than a diameter $d_w$ of the semiconductor wafer 1, which is a lateral size of the semiconductor wafer 1. Likewise, also the first pole piece 24 has a larger diameter in the fifth embodiment than that of the first pole piece 4 in the first embodiment. Due to the larger diameter $d_2'$ of the first metal disk 22 compared to that of the semiconductor wafer 1, the protection layer 48 is fixed or glued not only to a lateral side surface 223 of the first metal disk 22 but also to a circumferential edge portion of an upper side 224 of the first metal disk 22. The larger diameter $d_2'>d_w$ improves the removal of heat during operation of the power semiconductor device 500. The other characteristics and features of the first metal disk 22, the first pole piece 24 and the protection layer 48 are the same as that of the first metal disk 2, the first pole piece 4 and the protection layer 18 in the first embodiment, respectively.

Figure 6:
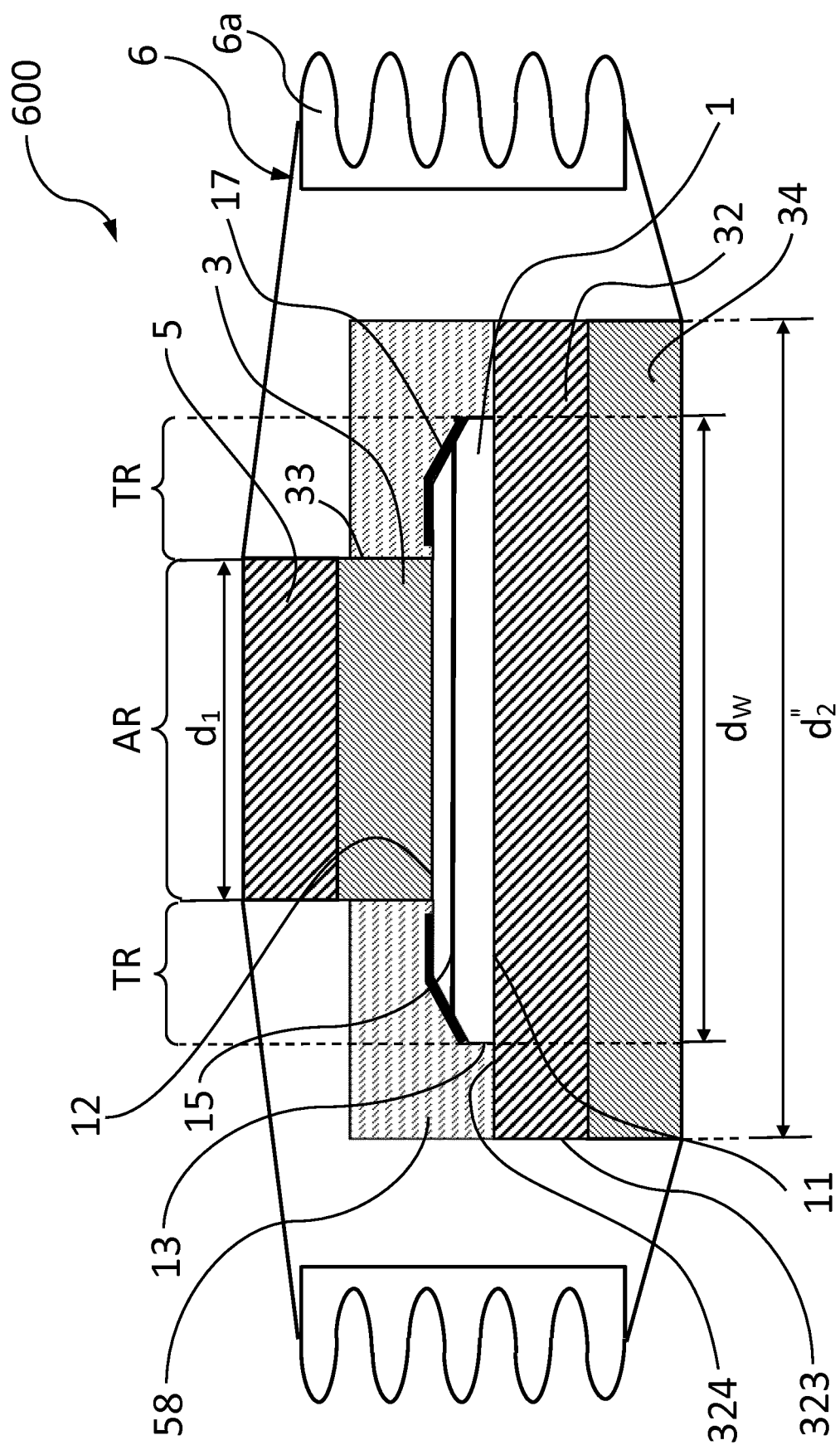
FIG. 6 shows a cross-section of a power semiconductor device according to a sixth embodiment.

In the following a power semiconductor device 600 according to a sixth embodiment is explained with reference to FIG. 6. Due to the many similarities between the fifth and the sixth embodiment, only differences between these two embodiments will be described in the following. With regard to all other features it is referred to the above discussion of the fifth embodiment. Like in the above discussed power semiconductor device 500 the power semiconductor device 600 has a first metal disk 32 that has a diameter $d_2''$, which is a lateral size of the first metal disk 2, that is larger than a diameter $d_w$ of the semiconductor wafer 1, which is a lateral size of the semiconductor wafer 1. Likewise, also the first pole piece 34 has a larger diameter in the sixth embodiment than that of the first pole piece 4 in the first embodiment. Contrary to the protection layer 48 in the fifth embodiment, the protection layer 58 in the sixth embodiment is fixed or glued only to a circumferential edge portion of an upper side 324 of the first metal disk 32, but not to a lateral side surface 323 of the first metal disk 32. The relatively large diameter $d_2''>d_w$ improves the removal of heat during operation of the power semiconductor device 600. The other characteristics and features of the first metal disk 32, the first pole piece 34 and the protection layer 58 are the same as that of the first metal disk 22, the first pole piece 24 and the protection layer 48 in the fifth embodiment, respectively.

In a comparative example which is not covered by the appended claims a power semiconductor device is provided that is the same as the power semiconductor device according to the sixth embodiment except that the first metal disk 32 is bonded to the semiconductor wafer 1 by bonding or brazing.

In an exemplary method for manufacturing a power semiconductor device 100, 200, 300, 400, 500, 600 according to anyone of the above discussed embodiments, the protection layer 18, 28, 38, 48, 58 may be formed by transfer molding. In this case the protection layer 18, 28, 38, 48, 58 may be made of a thermosetting polymer. Transfer molding has the advantage compared to other molding techniques that the viscosity of the thermosetting polymer during the transfer molding process is relatively high.

Accordingly, the use of transfer molding is in particular advantageous for the manufacture of power semiconductor devices 100, 200, 400, 500, 600 where the first metal disk 2, 22, 32 and/or second metal disk 3 is fixed or glued to the protection layer 18, 38, 48, 58 as in the above embodiments shown in FIGS. 1, 2, and 4-6. A high viscosity of the thermosetting polymer results in that the polymer does not easily enter into a gap between the first metal disk 2, 22 and the semiconductor wafer 1 and/or into a gap between the second metal disk 3 and the semiconductor wafer 1 during the molding process. Other advantages of transfer molding compared to other molding techniques, such as injection molding, are relatively low molding equipment costs, short cycle time, and low tool maintenance costs.

It will be apparent for persons skilled in the art that modifications of the above described embodiment are possible without departing from the idea of the invention as defined by the appended claims.

In the above embodiments either the protection layer 28 is fixed or glued to none of the first metal disk 2 and the second metal disk 3 as in the third embodiments shown in FIG. 3, or the protection layer 18, 38, 48, 58 is fixed or glued to both, to the first metal disk 2 and to the second metal disk 3 as in the remaining embodiments shown in FIGS. 1, 2, and 4 to 6. However, the protection layer may also be glued or fixed to only one of the first and the second metal disks.

In the above embodiments the power semiconductor device 100, 200, 300, 400, 500 600 included a housing 6. However, the power semiconductor device may not include the housing. Exemplarily the power semiconductor may be a housing less power semiconductor device.

In the above embodiments the power semiconductor device included the first and the second pole piece and the second metal disk. However, each of these elements is an optional feature and the power semiconductor device may not include these elements.

In the above embodiments the semiconductor wafer 1, the first metal disk 2, 22, 32 and the second metal disk 3 are described to have a circular shape (in an orthogonal projection onto a plane parallel to the first main side), respectively. Accordingly, a single diameter was used to characterize a lateral size of the first metal disk 2, the second metal disk 3 and the semiconductor wafer 1, respectively. However, the invention is not limited to such a specific shape of the semiconductor wafer 1, the first metal disk 2 and the second metal disk 3. In general the shape of first metal disk 2, the second metal disk 3 and the semiconductor wafer 1 may be any shape, and the lateral size of the first metal disk 2, the second metal disk 3 and the semiconductor wafer 1 may respectively depend on the lateral direction, i.e. may be different for two different lateral directions. In such generalized case the lateral dimension of the first metal disk 2 is the same or larger in any lateral direction. For example the shape of the semiconductor wafer and that of the first metal disk may be a rectangular shape having a short side and a long side, respectively, wherein the short side of the semiconductor wafer is parallel to the short side of the first metal disk and the long side of the semiconductor wafer is parallel to the long side of the first metal disk. In this exemplary case a length of the shorter side of the first metal disk shall be the same or larger than that of the semiconductor wafer, and a length of the longer side of the first metal disk shall be the same or larger than that of the semiconductor wafer.

In the above embodiments illustrated in FIGS. 1 to 6 the junction termination is exemplarily shown as a single-side single positive bevel. However, the invention is not limited to any specific kind of junction termination as long as the junction termination is arranged along the circumferential edge of the semiconductor wafer. The junction termination may exemplarily include single-side single negative bevel, single positive bevel, double positive bevel, combined positive-negative bevel, or a planar junction termination such as junction termination extension (JTE), a variation of lateral doping (VLD) and floating field ring terminations (FFR) with and without field plate extensions.

Figure 2:
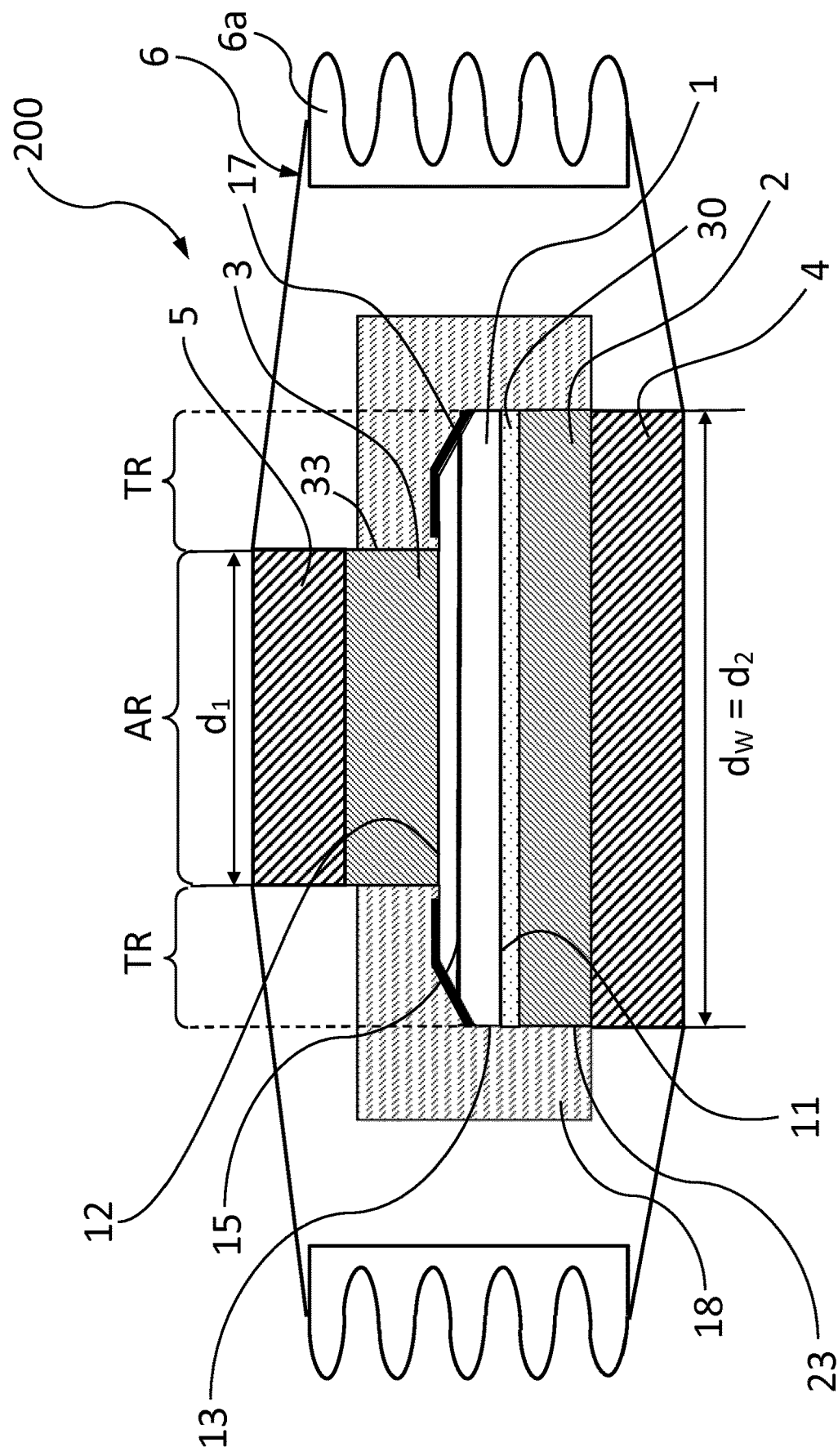
FIG. 2 shows a cross-section of a power semiconductor device according to a second embodiment.

In the above second embodiment shown in FIG. 2 a metal layer 30 is sandwiched between the first metal disk 2 and the semiconductor wafer 1. A metal layer having the same characteristics as the metal layer 30 may also be sandwiched between the second metal disk 3 and the semiconductor wafer 1 of each one of the above embodiments. Such metal layer sandwiched between the second metal disk 3 and the semiconductor wafer 1 could be encapsulated efficiently with the protection layer 18 being fixed or glued to the semiconductor wafer 1 and to the lateral side surface 33 of the second metal disk 3, so that leakage of material of such metal layer in a liquid state could be prevented.

It should be noted that the term "comprising" does not exclude other elements or steps and that the indefinite article "a" or "an" does not exclude the plural. Also elements described in association with different embodiments may be combined.

LIST OF REFERENCE SIGNS 1 semiconductor wafer
2, 22, 32 first metal disk
3 second metal disk
4, 24, 34 first pole piece
5 second pole piece
6 housing
6a ceramic housing portion
11 first main side
12 second main side
13 lateral side of the semiconductor wafer
15 junction
17 passivation layer
18, 28, 38, 48 protection layer
224, 324 edge portion of upper side surface of the first metal disk
23, 223, 323 lateral side surface of the first metal disk
23a first portion of lateral side surface of the first metal disk
23b second portion of lateral side surface of the first metal disk
28a first gap
28b second gap
23 lateral side surface of the first metal disk
30 metal layer
33 lateral side surface of the second metal disk
100 power semiconductor device according to first embodiment
200 power semiconductor device according to second embodiment
300 power semiconductor device according to third embodiment
400 power semiconductor device according to fourth embodiment
500 power semiconductor device according to fifth embodiment
600 power semiconductor device according to sixth embodiment
AR active region
$d_1$ diameter of the second metal disk
$d_2$, $d_2'$, $d_2''$ diameter of the first metal disk
$d_w$ diameter of the semiconductor wafer
TR junction termination region

The invention claimed is:

1. A power semiconductor device, comprising:
a semiconductor wafer having a first main side, a second main side opposite to the first main side, a lateral side connecting the first main side and the second main side, a junction and a junction termination laterally surrounding the junction;
a protection layer covering the lateral side of the semiconductor wafer and covering the second main side at least in an area of the junction termination;
a first metal disk formed of molybdenum or tungsten arranged on the first main side to cover the first main side of the semiconductor wafer, the first metal disk having a lateral size that is the same as or larger than a lateral size of the semiconductor wafer, wherein an interface between the first metal disk and the semiconductor wafer is a free floating interface; and
a metal layer sandwiched between the first metal disk and the semiconductor wafer, the metal layer having a melting point below 150° C.

2. The power semiconductor device according to claim 1, wherein the metal layer has a melting point below 100° C.

3. The power semiconductor device according to claim 1, wherein the protection layer comprises a thermosetting polymer material.

4. The power semiconductor device according to claim 1, wherein the protection layer comprises an epoxy or a hybrid epoxy imide compound polymer.

5. The power semiconductor device according to claim 1, wherein the protection layer is made of a rubber.

6. The power semiconductor device according to claim 5, wherein the protection layer is made of a silicone rubber.

7. The power semiconductor device according to claim 1, further comprising a passivation layer covering the second main side at least in an area of the junction termination, wherein the protection layer hermetically seals the passivation layer.

8. The power semiconductor device according to claim 1, wherein the protection layer is fixed to the semiconductor wafer and to the first metal disk so that the first metal disk is fixed to the semiconductor wafer by the protection layer.

9. The power semiconductor device according to claim 1, wherein the protection layer seals the interface between semiconductor wafer and the first metal disk against an atmosphere surrounding the power semiconductor device.

10. The power semiconductor device according to claim 1, wherein the protection layer is spaced from the first metal disk by a gap.

11. The power semiconductor device according to claim 1, wherein lateral size of the first metal disk is larger than the lateral size of the semiconductor wafer.

12. The power semiconductor device according to claim 11, wherein the protective layer is fixed to an upper portion but not a side portion of the first metal disk.

13. The power semiconductor device according to claim 1, further comprising a second metal disk arranged on the second main side of the semiconductor wafer, wherein an interface between the second metal disk and the semiconductor wafer is a free floating interface.

14. The power semiconductor device according to claim 13, wherein the second metal disk is a molybdenum or tungsten or silver disk.

15. The power semiconductor device according to claim 13, wherein a second metal layer is sandwiched between the second metal disk and the semiconductor wafer, the second metal layer having a melting point below 150° C.

16. The power semiconductor device according to claim 1, wherein the metal layer is a layer of any one of gallium (Ga), indium (In), cesium (Cs), rubidium (Rb) and their alloys, a layer of an alloy of tin (Sn), bismuth (Bi), lead (Pb) and cadmium (Cd), or a layer of an alloy of aluminum (Al), gallium (Ga), indium (In), thallium, (Tl), a layer of an eutectic alloy based on Gallium (Ga) that eutectic alloy remains liquid at room temperature, an eutectic alloy of GaIn, GaInSn and GaInSnZn, or mixtures and alloys thereof.

17. The power semiconductor device according to claim 1, wherein a thickness of the metal layer is in a range from 0.1 μm to 500 μm.

18. The power semiconductor device according to claim 17, wherein a thickness of the metal layer is in a range or from 1 μm to 100 μm.

19. A method for manufacturing a power semiconductor device according to claim 14, wherein the protection layer is formed by transfer molding.

20. A power semiconductor device, comprising:
a semiconductor wafer having a first main side, a second main side opposite to the first main side, a lateral side connecting the first main side and the second main side, a junction and a junction termination laterally surrounding the junction;
a passivation layer covering the second main side at least in an area of the junction termination;
a protection layer covering the lateral side of the semiconductor wafer and covering the second main side at least in an area of the junction termination, wherein the protection layer hermetically seals the passivation layer;
a first metal disk formed of molybdenum or tungsten arranged on the first main side to cover the first main side of the semiconductor wafer, the first metal disk having a lateral size that is the same as or larger than a lateral size of the semiconductor wafer, wherein an interface between the first metal disk and the semiconductor wafer is a free floating interface;
a metal layer sandwiched between the first metal disk and the semiconductor wafer, the metal layer having a melting point below 150° C.;
a second metal disk arranged on the second main side of the semiconductor wafer, wherein an interface between the second metal disk and the semiconductor wafer is a free floating interface;
a first pole piece arranged on the first metal disk so that the first metal disk is between the first pole piece and the wafer;
a second pole piece arranged on the second metal disk so that the second metal disk is between the second pole piece and the wafer; and
a housing enclosing the wafer, the first metal disk, and the second metal disk.

21. A power semiconductor device, comprising:
a semiconductor wafer having a first main side, a second main side opposite to the first main side, a lateral side connecting the first main side and the second main side, a junction and a junction termination laterally surrounding the junction;
a protection layer covering the lateral side of the semiconductor wafer and covering the second main side at least in an area of the junction termination, wherein the protection layer comprises a thermosetting polymer material, an epoxy, a hybrid epoxy imide compound polymer, or a rubber;
a first metal disk formed of molybdenum or tungsten arranged on the first main side to cover the first main side of the semiconductor wafer, the first metal disk having a lateral size that is the same as or larger than a lateral size of the semiconductor wafer, wherein an interface between the first metal disk and the semiconductor wafer is a free floating interface;
a metal layer sandwiched between the first metal disk and the semiconductor wafer, the metal layer having a melting point below 100° C.;
a passivation layer covering the second main side at least in an area of the junction termination, wherein the protection layer hermetically seals the passivation layer so that the interface between semiconductor wafer and the first metal disk is sealed against an atmosphere surrounding the power semiconductor device;
a second metal disk arranged on the second main side of the semiconductor wafer, wherein an interface between the second metal disk and the semiconductor wafer is a free floating interface; and
a second metal layer sandwiched between the second metal disk and the semiconductor wafer, the second metal layer having a melting point below 100° C.

* * * * *